(12) United States Patent
Du

(10) Patent No.: US 10,274,793 B2
(45) Date of Patent: Apr. 30, 2019

(54) COA ARRAY SUBSTRATE AND DISPLAY DEVICE

(71) Applicant: SHENZHEN CHINA STAR OPTOELECTRONICS TECHNOLOGY CO., LTD., Guangdong (CN)

(72) Inventor: Peng Du, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 183 days.

(21) Appl. No.: 15/323,975

(22) PCT Filed: Dec. 14, 2016

(86) PCT No.: PCT/CN2016/109867
§ 371 (c)(1),
(2) Date: Jan. 5, 2017

(87) PCT Pub. No.: WO2018/058797
PCT Pub. Date: Apr. 5, 2018

(65) Prior Publication Data
US 2018/0164647 A1    Jun. 14, 2018

(51) Int. Cl.
*G06F 3/044* (2006.01)
*G02F 1/1343* (2006.01)
(Continued)

(52) U.S. Cl.
CPC ...... *G02F 1/134336* (2013.01); *G02F 1/1368* (2013.01); *G02F 1/13338* (2013.01);
(Continued)

(58) Field of Classification Search
CPC ........... G02F 1/134336; G02F 27/1244; G02F 27/1248; G02F 2201/121; G02F 1/133305;
(Continued)

(56) References Cited

U.S. PATENT DOCUMENTS

2004/0233352 A1* 11/2004 Chen ................. G02F 1/136209
349/106
2010/0194697 A1* 8/2010 Hotelling ............. G06F 3/0412
345/173
(Continued)

FOREIGN PATENT DOCUMENTS

CN    102081484 A    6/2011
CN    102193700 A    9/2011
(Continued)

*Primary Examiner* — Mark Edwards
(74) *Attorney, Agent, or Firm* — Mark M. Friedman

(57) ABSTRACT

The present disclosure provides a COA array substrate and a display device. The COA array substrate includes a plurality of gate lines; a plurality of data lines; and a plurality of pixel units. Each of the pixel units includes a pixel electrode and a common electrode. The common electrode includes a lower common electrode and an upper common electrode. The lower common electrode is disposed on one of the data lines, and the upper common electrode is disposed on one of the gate lines. The present disclosure solves a light leakage problem and problems that an aperture ratio and a transmittance are low in a liquid crystal panel.

13 Claims, 4 Drawing Sheets

(51) Int. Cl.
*H01L 27/12* (2006.01)
*G02F 1/1362* (2006.01)
*G02F 1/1368* (2006.01)
*G02F 1/1333* (2006.01)
*G06F 3/041* (2006.01)

(52) U.S. Cl.
CPC .. *G02F 1/133305* (2013.01); *G02F 1/133345* (2013.01); *G02F 1/134309* (2013.01); *G02F 1/136204* (2013.01); *G02F 1/136286* (2013.01); *G06F 3/044* (2013.01); *G06F 3/0412* (2013.01); *G06F 3/0416* (2013.01); *H01L 27/1244* (2013.01); *H01L 27/1248* (2013.01); *G02F 2001/136218* (2013.01); *G02F 2001/136222* (2013.01); *G02F 2201/121* (2013.01); *G02F 2201/123* (2013.01); *G06F 2203/04103* (2013.01); *G06F 2203/04107* (2013.01); *G06F 2203/04112* (2013.01)

(58) Field of Classification Search
CPC ........... G02F 1/133345; G02F 1/13383; G02F 1/136286; G02F 1/1368; G02F 1/136204; G02F 1/134309; G02F 2001/136218; G02F 2001/136222; G02F 2201/123; G06F 3/0412; G06F 3/0416; G06F 3/044; G06F 2203/04103; G06F 2203/04107; G06F 2203/04112; H01L 27/1244; H01L 27/1248
USPC ........................................................ 345/174
See application file for complete search history.

(56) References Cited

U.S. PATENT DOCUMENTS

| | | |
|---|---|---|
| 2012/0313881 A1 | 12/2012 | Ge et al. |
| 2014/0253851 A1 | 9/2014 | Takano et al. |
| 2015/0309377 A1* | 10/2015 | Choi ................. G02F 1/133514 349/43 |
| 2017/0286740 A1 | 10/2017 | Liu et al. |

FOREIGN PATENT DOCUMENTS

| | | | |
|---|---|---|---|
| CN | 202711227 U | | 1/2013 |
| CN | 103226423 A | | 7/2013 |
| CN | 104238222 A | * | 12/2014 |
| CN | 104809448 A | | 7/2015 |
| WO | 2012118513 A1 | | 9/2012 |

* cited by examiner

COA ARRAY SUBSTRATE AND DISPLAY DEVICE

BACKGROUND OF THE INVENTION

Field of Invention

The present invention relates to a liquid crystal display field, and more particularly to a COA array substrate and a display device.

Description of Prior Art

Flat liquid crystal display devices, such as liquid crystal displays (LCDs), have advantages of high quality, power saving, a thin structure, and a wide application. Accordingly, the liquid crystal display devices are widely utilized in various consumer electronic products, e.g., mobile phones, televisions, personal digital assistants, digital cameras, notebooks, desktop computers, and they become mainstream display devices. Currently, most of the liquid crystal display device on the market are backlight type liquid crystal display devices, and each comprises a thin film transistor liquid crystal display (TFT-LCD) panel and a backlight module. An operating principle of the liquid crystal display panel is to place liquid crystal molecules between two glass substrates which are parallel with each other. Vertical and horizontal fine wirings are disposed between the two glass substrates. Orientations of the liquid crystal molecules are controlled to be changed by providing electricity. An image is generated by refracting light from the backlight module. In-cell capacitance screens, which integrate a touch function with internal units, become increasingly popular because of advantages that the display panels can be thinned and outdoor visibility can be increased. In a traditional panel design and an in-cell design, at least two additional layers are required to include touch sensors manufactured thereon, and thus manufacturing cost is increased. In a traditional pixel design, a black matrix (BM) is utilized to shade light. However, the black matrix is positioned on a color filter (CF) substrate. When a curved display device is bent, a problem that an upper substrate and a lower substrate are misaligned with each other might occur. Accordingly, a risk of light leakage exists, a panel, which is normal in a flat state, has mura phenomenon in a curved state.

To solve the problem, a DBS (Data Line BM Less) pixel design is utilized more and more in a curved display panel. In this design, ITO (Indium Tin Oxide) wirings cover data lines. A width of each of the ITO wirings is slightly wider than a width of each of the data lines. The ITO wirings are connected to common electrodes. When the panel is operated normally, an electric field generated by the ITO wirings and the common electrodes can control the liquid crystal molecules not to be oriented, so as to achieve an objective of shading the light. Furth, this design has an advantage that the ITO wirings utilized for shading the light are positioned on a TFT substrate (i.e., an array substrate). When the panel is manufactured as a curved display device and the curved display device is bent, positions of the ITO wirings are not changed relative to positions of the data lines. As a result, the problem of the light leakage does not exist.

FIG. 5 is a DBS pixel design of wirings of common electrodes in a display area in the prior art. FIG. 5 shows a mesh structure. The wirings of the common electrodes 4 in a vertical direction have a light shading function for data lines. The wirings of the common electrodes 6 in a horizontal direction are connected to the wirings of the common electrodes 4 in the vertical direction to form the mesh structure, so as to ensure stability of a voltage of a common signal.

FIG. 4 is a cross-sectional view of a DBS pixel including a data line 1 in the prior art. The pixel is manufactured on a COA (color filter on array) substrate on which a color filter is manufactured. A wiring of a common electrode 4 in the vertical direction is positioned above the data line 1, and its width is greater than a width of the data line 1. A pixel electrode 5 includes light transmitting areas at two sides of the data line 1. Since the common electrode 4 in the vertical direction and the pixel electrode 5 are manufactured of the same metal layer, a minimum distance S1 between the common electrode 4 and the pixel electrode 5 is required to prevent a short circuit. Accordingly, an area of the pixel electrode 5 is limited, and an aperture ratio and a transmittance are difficult to be increased.

SUMMARY OF THE INVENTION

An objective of the present disclosure is to provide a COA array substrate and a display device for solving a light leakage problem that an upper substrate and a lower substrate are misaligned with each other in the prior art when a DBS liquid crystal panel is bent, and solving problems that an aperture ratio and a transmittance of the DBS liquid crystal panel are low.

A technical scheme of the present disclosure is described as follows.

A COA array substrate comprises:

A plurality of gate lines;

A plurality of data lines intersecting with the gate lines; and

A plurality of pixel units defined by the gate lines and the data lines, and each of the pixel units comprising a pixel electrode and a common electrode.

The common electrode includes a lower common electrode and an upper common electrode which are positioned in different layers. The lower common electrode is disposed on one of the data lines and covers the one of the data lines, and the upper common electrode is disposed on one of the gate lines and covers the one of the gate lines.

The lower common electrode is parallel with the data lines, and the upper common electrode is parallel with the gate lines.

The upper common electrode is positioned in a same layer as the pixel electrode. A first predetermined horizontal distance is maintained between the upper common electrode and the pixel electrode. The first predetermined horizontal distance prevents a short circuit between the upper common electrode and the pixel electrode.

Preferably, a second predetermined horizontal distance is maintained between each of vertical extending lines at two sides of the lower common electrode and the pixel electrode. The second predetermined horizontal distance prevents a capacitance from being formed between the lower common electrode and the pixel electrode.

Preferably, an insulating layer is disposed between the lower common electrode and the upper common electrode. The lower common electrode is covered by the insulating layer. A color resist layer is disposed between one of the data lines and the lower common electrode.

Preferably, terminals of at least two of the lower common electrodes are connected together. The at least two of the lower common electrodes are integrally formed as a sensing electrode. Terminals of at least two of the upper common electrodes are connected together. The at least two of the upper common electrodes are integrally formed as a driving electrode. A sensing capacitance is formed in an overlapping part of the sensing electrode and the driving electrode.

Preferably, a shielding structure is disposed between two adjacent ones of the sensing electrodes for preventing signals from interfering with each other.

Preferably, the shielding structure is a metal sheet, the metal sheet is positioned in a same layer as the lower common electrode, and the metal sheet and the lower common electrode are made of a same material.

Preferably, the pixel electrode, the upper common electrode, and the metal sheet are manufactured in a same manufacturing step.

A COA array substrate comprises:

A plurality of gate lines;

A plurality of data lines intersecting with the gate lines; and

A plurality of pixel units defined by the gate lines and the data lines, and each of the pixel units comprising a pixel electrode and a common electrode.

The common electrode includes a lower common electrode and an upper common electrode which are positioned in different layers. The lower common electrode is disposed on one of the data lines and covers the one of the data lines. The upper common electrode is disposed on one of the gate lines and covers the one of the gate lines.

Preferably, the lower common electrode is parallel with the data lines, and the upper common electrode is parallel with the gate lines.

Preferably, the upper common electrode is positioned in a same layer as the pixel electrode. A first predetermined horizontal distance is maintained between the upper common electrode and the pixel electrode. The first predetermined horizontal distance prevents short circuit between the upper common electrode and the pixel electrode.

Preferably, a second predetermined horizontal distance is maintained between each of vertical extending lines at two sides of the lower common electrode and the pixel electrode. The second predetermined horizontal distance prevents a capacitance from being formed between the lower common electrode and the pixel electrode.

Preferably, an insulating layer is disposed between the lower common electrode and the upper common electrode. The lower common electrode is covered by the insulating layer. A color resist layer is disposed between one of the data lines and the lower common electrode.

Preferably, terminals of at least two of the lower common electrodes are connected together, and the at least two of the lower common electrodes are integrally formed as a sensing electrode. Terminals of at least two of the upper common electrodes are connected together, and the at least two of the upper common electrodes are integrally formed as a driving electrode. A sensing capacitance is formed in an overlapping part of the sensing electrode and the driving electrode.

Preferably, a shielding structure is disposed between two adjacent ones of the sensing electrodes for preventing signals from interfering with each other.

Preferably, the shielding structure is a metal sheet. The metal sheet is positioned in a same layer as the lower common electrode. The metal sheet and the lower common electrode are made of a same material.

Preferably, the pixel electrode, the upper common electrode, and the metal sheet are manufactured in a same manufacturing step.

A display device comprises any of the above-mentioned COA array substrates.

Advantageous effects of the present disclosure are described as follows.

In the COA array substrate of the display device in accordance with the present disclosure, the common electrode is divided into the lower common electrode and the upper common electrode. The lower common electrode is disposed on the data line to cover the data line. The upper common electrode is disposed on the gate line to cover the gate line. Accordingly, a black matrix (BM) utilized for providing a light shading function for the data line and the gate line is not required. Furthermore, the present disclosure can solve a light leakage problem that an upper substrate and a lower substrate are misaligned with each other when a DBS liquid crystal panel is bent. The present disclosure also can solve problems that an aperture ratio and a transmittance of the DBS liquid crystal panel are low.

DETAILED DESCRIPTION OF THE PREFERRED EMBODIMENTS

Figure 1:
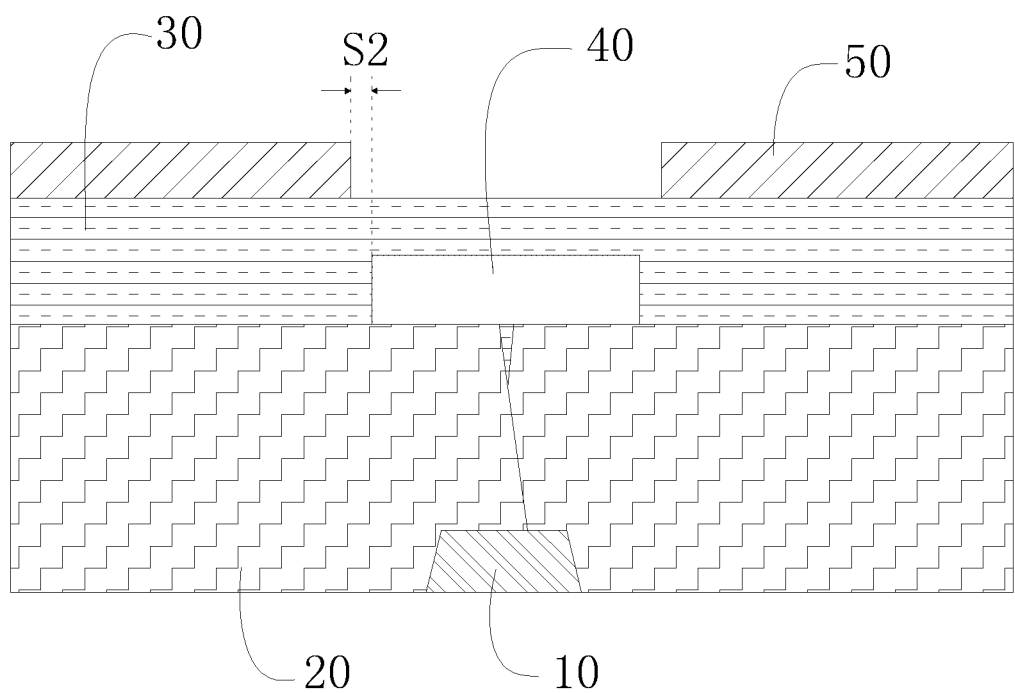
FIG. 1 is a cross-sectional view of a display area including a data line in a COA array substrate in accordance with an embodiment of the present disclosure.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto. In the drawings, structure-like elements are labeled with like reference numerals.

Embodiment 1

Please refer to FIG. 1. FIG. 1 is a cross-sectional view of a display area including a data line 10 in a COA array substrate in accordance with an embodiment of the present disclosure. It can be seen from FIG. 1 that the COA array substrate in accordance with the present disclosure includes:

A plurality of gate lines (not shown) configured to input driving signals;

A plurality of data lines 10 intersecting with the gate lines and configured to input data signals to pixel electrodes 50; and A plurality of pixel units defined by the gate lines and the data lines 10, and each of the pixel units including a pixel electrode and a common electrode.

The common electrode includes a lower common electrode 40 and an upper common electrode 60 which are positioned in different layers. The upper common electrode 60 is positioned on the lower common electrode 40. The lower common electrode 40 is disposed on the data line 10 and covers the data line 10. The upper common electrode 60 is disposed on the gate line and covers the gate line. Furthermore, a width of the lower common electrode 40 is greater than a width of the data line 10. A width of the upper common electrode 60 is greater than a width of the gate line. In summary, an area of each of the data lines 10 is smaller than an area of the corresponding lower common electrode 40. An area of each of the gate lines is smaller than an area of the corresponding upper common electrode 60.

Herein, the lower common electrode 40 provides a light shading function for the data line 10, and thus it is not necessary to dispose a black matrix to shade light. Similarly, the upper common electrode 60 also provides a light shading function for the gate line, and thus it is not necessary to dispose a black matrix to shade light.

In the present embodiment, the lower common electrode 40 is parallel with the data lines 10, and the upper common electrode 60 is parallel with the gate lines 10.

In the present embodiment, the upper common electrode 60 is positioned in a same layer as the pixel electrode 50, and a first predetermined horizontal distance is maintained between the upper common electrode 60 and the pixel electrode 50. The first predetermined horizontal distance can prevent a short circuit between the upper common electrode 60 and the pixel electrode 50.

In the present embodiment, a second predetermined horizontal distance S2 is maintained between each of vertical extending lines at two sides of the lower common electrode 40 and the pixel electrode 50. The second predetermined horizontal distance S2 can prevent a capacitance from being formed between the lower common electrode 40 and the pixel electrode 50.

In the present embodiment, an insulating layer 30 is disposed between the lower common electrode 40 and the upper common electrode 60. The lower common electrode 40 is covered by the insulating layer 30. A color resist layer 20 is disposed between the data line 10 and the lower common electrode 40.

Figure 2:
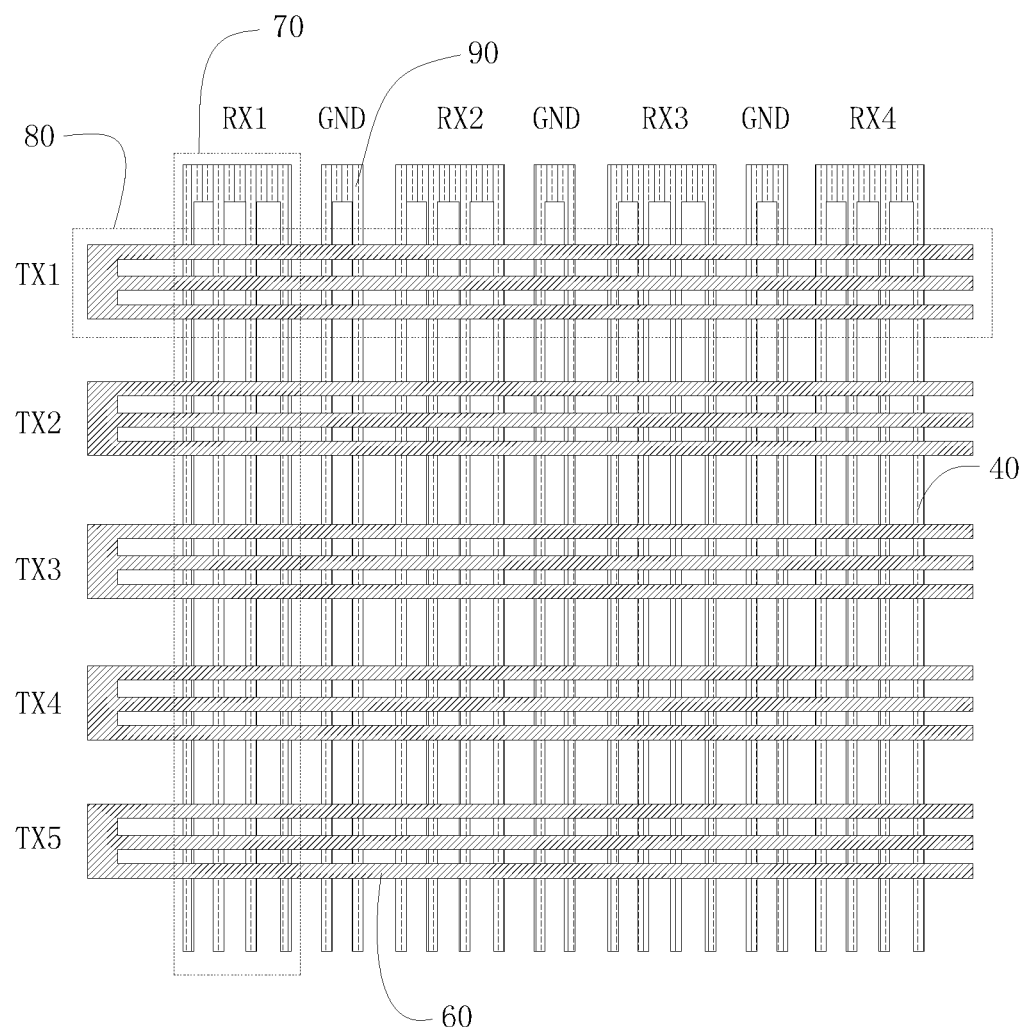
FIG. 2 is a layout diagram of the display area, including the lower common electrode and the top common electrode and excluding the pixel electrode, and an edge area in the COA array substrate in accordance with an embodiment of the present disclosure.

Please refer to FIG. 2. FIG. 2 is a layout diagram of the display area, including the lower common electrode 40 and the top common electrode 60 and excluding the pixel electrode 50, and an edge area in the COA array substrate in accordance with an embodiment of the present disclosure.

In the present embodiment, terminals of at least two of the lower common electrodes 40 are connected together. The at least two of the lower common electrodes 40 are integrally formed as a sensing electrode 70 which is represented as RX. Terminals of at least two of the upper common electrodes 60 are connected together. The at least two of the upper common electrodes 60 are integrally formed as a driving electrode 80 which is represented as TX. A sensing capacitance is formed in an overlapping part of the sensing electrode 70 and the driving electrode 80. Herein, an objective of integrally forming the at least two of the lower common electrodes 40 as the sensing electrode 70 is to make the sensing electrode 70 reach a certain width. Similarly, an objective of integrally forming the at least two of the upper common electrodes 60 as the driving electrode 80 is to make the driving electrode 80 reach a certain width. The sensing capacitance is effectively formed only when the width of the sensing electrode 70 and the width of the driving electrode 80 reach a certain width, such as 5-6 millimeters (mm).

In the present embodiment, a shielding structure 90 is disposed between two adjacent ones of the sensing electrodes 70 for preventing signals from interfering with each other.

In the present embodiment, preferably, the shielding structure 90 is a metal sheet. The metal sheet is positioned in a same layer as the lower common electrode 40. The metal sheet and the lower common electrode 40 are made of a same material.

In the present embodiment, the pixel electrode 50, the upper common electrode 60, and the metal sheet are manufactured in a same manufacturing step. Accordingly, manufacturing steps can be simplified, and manufacturing cost can be reduced.

Figure 3:
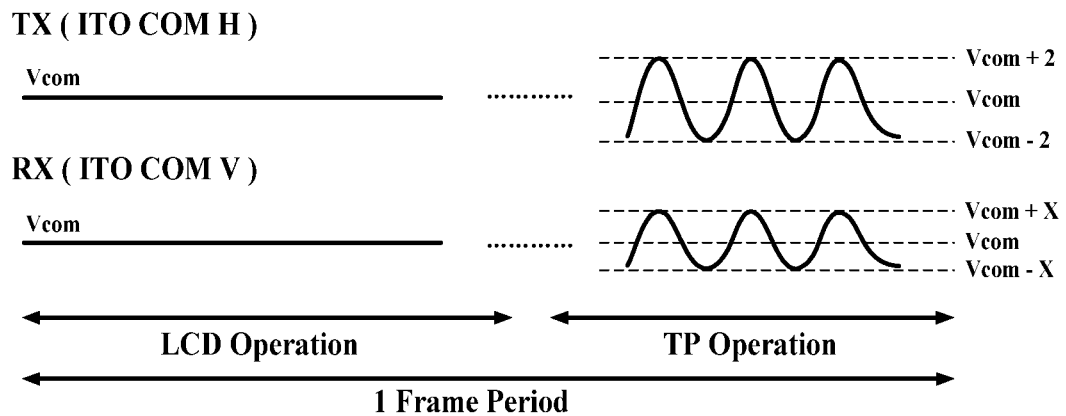
FIG. 3 is a waveform diagram in accordance with an embodiment of the present disclosure when the lower common electrode and the upper common electrode are operated.
Figure 4:
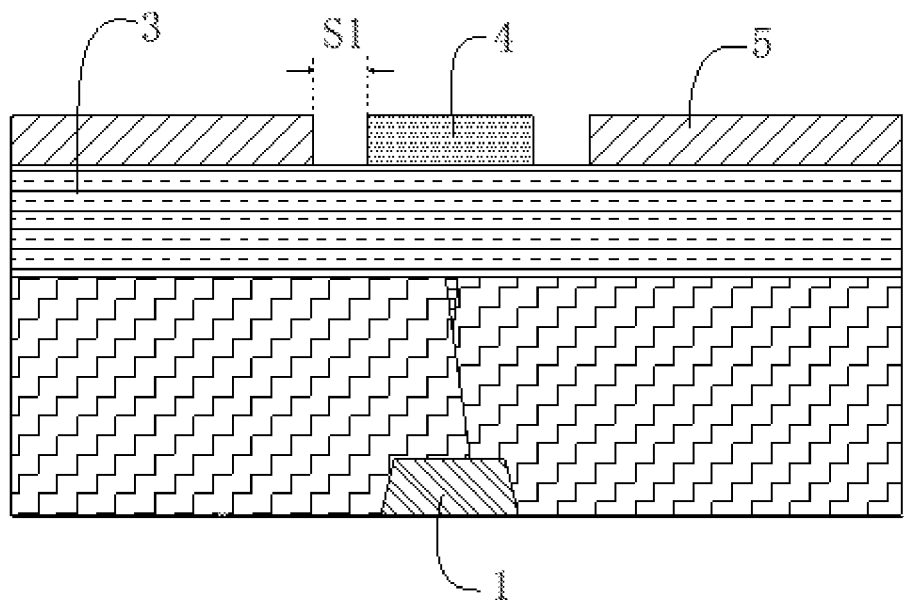
FIG. 4 is a cross-sectional view of a display area including a data line in a COA array substrate in the prior art.
Figure 5:
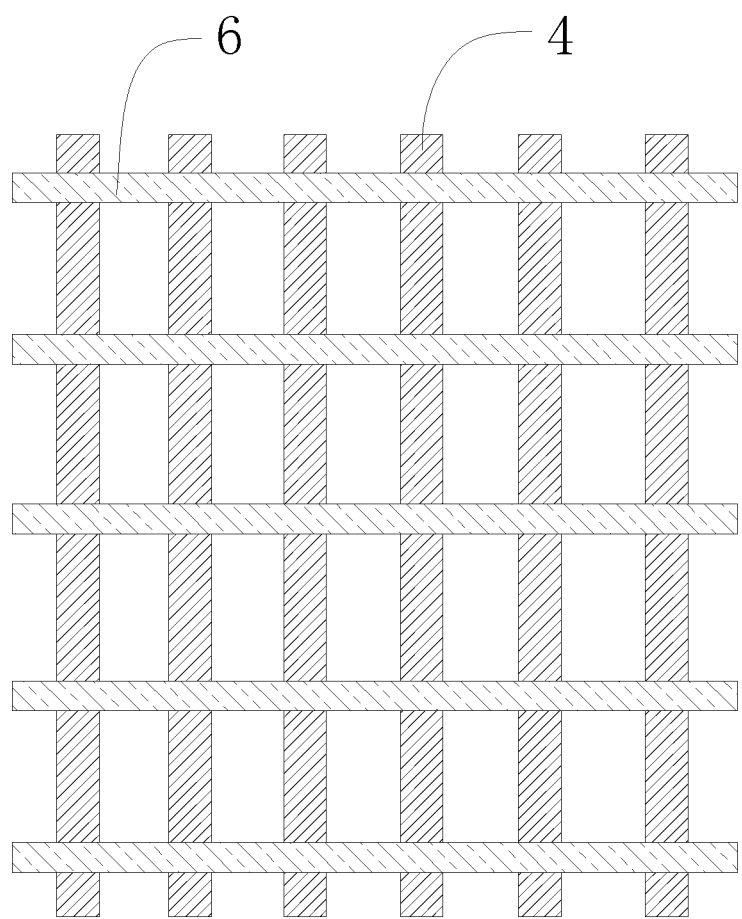
FIG. 5 is a layout diagram of a display area, including a lower common electrode and a top common electrode and excluding a pixel electrode, and an edge area in a COA array substrate in the prior art.

Please refer to FIG. 3. FIG. 3 is a waveform diagram in accordance with an embodiment of the present disclosure when the lower common electrode 40 and the upper common electrode 60 are operated. It can be seen from FIG. 3 that a frame of a picture (i.e., one frame period in FIG. 3) includes an LCD operation time segment and a touch detection operation time segment. In the LCD operation time segment, waveforms of the lower common electrodes 40 and the upper common electrode 60 are the same as those in a conventional TFT-LCD. Herein, taking a direct current (DC) Vcom signal as an example. In the touch detection operation time segment, a TX signal provides a high-frequency sine wave. A center value of the TX signal is the same as the Vcom signal in the display time segment. An amplitude of the TX signal is 2V. Accordingly, a highest voltage is Vcom+2V, and a lowest voltage is Vcom-2V. A RX signal is set as the Vcom (a direct current voltage). Due to capacitance coupling effect, a sine wave having a smaller amplitude is correspondingly generated in a wiring of the RX signal. Since a frequency is of the sine wave is far higher than a frequency of liquid crystal molecules, the sine wave does not have adverse effect on display quality. Please refer to FIG. 2 and FIG. 3. In the display time segment in one frame period, the Vcom signal is inputted to all the signals. In the touch detection time segment, the shielding structure 90 can provide a shielding function when the shielding structure 90 is in a ground (GND) state or the Vcom signal is inputted to the shielding structure 90.

In the COA array substrate and a display device in accordance with the present disclosure, the common electrode is divided into the lower common electrode 40 and the upper common electrode 60. The lower common electrode 40 is disposed on the data line 10 to cover the data line 10. The upper common electrode 60 is disposed on the gate line to cover the gate line. Accordingly, a black matrix (BM) utilized for providing a light shading function for the data line and the gate line is not required. Furthermore, the present disclosure can solve a light leakage problem that an upper substrate and a lower substrate are misaligned with each other when a DBS liquid crystal panel is bent. The present disclosure also can solve problems that an aperture ratio and a transmittance of the DBS liquid crystal panel are low.

Embodiment 2

The present disclosure provides a display device which includes the COA array substrate described in the embodiment 1. The COA array substrate is described in detail in the embodiment 1 and thus is not repeated herein.

In the COA array substrate of the display device in accordance with the present disclosure, the common electrode is divided into the lower common electrode 40 and the upper common electrode 60. The lower common electrode 40 is disposed on the data line 10 to cover the data line 10. The upper common electrode 60 is disposed on the gate line to cover the gate line. Accordingly, a black matrix (BM) utilized for providing a light shading function for the data line and the gate line is not required. Furthermore, the present disclosure can solve a light leakage problem that an upper substrate and a lower substrate are misaligned with each other when a DBS liquid crystal panel is bent. The present disclosure also can solve problems that an aperture ratio and a transmittance of the DBS liquid crystal panel are low.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A COA (color filter on array) array substrate, comprising:
   a plurality of gate lines;
   a plurality of data lines intersecting with the gate lines; and
   a plurality of pixel units defined by the gate lines and the data lines, and each of the pixel units comprising a pixel electrode and a common electrode,
   wherein the common electrode includes a lower common electrode and an upper common electrode which are positioned in different layers, the lower common electrode is disposed above and in alignment with when viewed above one of the data lines and has at least some common projection with when viewed above the one of the data lines, and the upper common electrode is disposed above and in alignment with when viewed above one of the gate lines and has at least some common projection with when viewed above the one of the gate lines,
   wherein the lower common electrode is parallel with the data lines, and the upper common electrode is parallel with the gate lines,
   wherein the upper common electrode is positioned in a same layer as the pixel electrode, a first predetermined horizontal distance is maintained between the upper common electrode and the pixel electrode, and the first predetermined horizontal distance prevents a short circuit between the upper common electrode and the pixel electrode,
   wherein terminals of at least two of the lower common electrodes are connected together, and the at least two of the lower common electrodes are integrally formed as a sensing electrode,
   terminals of at least two of the upper common electrodes are connected together, and the at least two of the upper common electrodes are integrally formed as a driving electrode,
   a sensing capacitance is formed in an overlapping part of the sensing electrode and the driving electrode,
   wherein a shielding structure is disposed between two adjacent ones of the sensing electrodes for preventing signals from interfering with each other, the shielding structure is a metal sheet, and the metal sheet is positioned in a same layer as the lower common electrode.

2. The COA array substrate of claim 1, wherein a second predetermined horizontal distance is maintained between each of vertical extending lines at two sides of the lower common electrode and the pixel electrode, and the second predetermined horizontal distance prevents an amount of capacitance that would be significant to a touch sensing function from being formed between the lower common electrode and the pixel electrode.

3. The COA array substrate of claim 1, wherein an insulating layer is disposed between the lower common electrode and the upper common electrode, the lower common electrode is covered by the insulating layer, and a color resist layer is disposed between one of the data lines and the lower common electrode.

4. The COA array substrate of claim 1, wherein the metal sheet and the lower common electrode are made of a same material.

5. The COA array substrate of claim 4, wherein the pixel electrode, the upper common electrode, and the metal sheet are manufactured in a same manufacturing step.

6. A COA (color filter on array) array substrate, comprising:
   a plurality of gate lines;
   a plurality of data lines intersecting with the gate lines; and
   a plurality of pixel units defined by the gate lines and the data lines, and each of the pixel units comprising a pixel electrode and a common electrode,
   wherein the common electrode includes a lower common electrode and an upper common electrode which are positioned in different layers, the lower common electrode is disposed above and in alignment with when viewed above one of the data lines and has at least some common projection with when viewed above the one of the data lines, and the upper common electrode is disposed above and in alignment with when viewed above one of the gate lines and has at least some common projection with when viewed above the one of the gate lines,
   wherein terminals of at least two of the lower common electrodes are connected together, and the at least two of the lower common electrodes are integrally formed as a sensing electrode,
   terminals of at least two of the upper common electrodes are connected together, and the at least two of the upper common electrodes are integrally formed as a driving electrode,
   a sensing capacitance is formed in an overlapping part of the sensing electrode and the driving electrode,
   wherein a shielding structure is disposed between two adjacent ones of the sensing electrodes for preventing signals from interfering with each other, the shielding structure is a metal sheet, and the metal sheet is positioned in a same layer as the lower common electrode.

7. The COA array substrate of claim 6, wherein the lower common electrode is parallel with the data lines, and the upper common electrode is parallel with the gate lines.

8. The COA array substrate of claim 6, wherein the upper common electrode is positioned in a same layer as the pixel electrode, a first predetermined horizontal distance is maintained between the upper common electrode and the pixel electrode, and the first predetermined horizontal distance prevents a short circuit between the upper common electrode and the pixel electrode.

9. The COA array substrate of claim 6, wherein a second predetermined horizontal distance is maintained between each of vertical extending lines at two sides of the lower common electrode and the pixel electrode, and the second predetermined horizontal distance prevents an amount of capacitance that would be significant to a touch sensing function from being formed between the lower common electrode and the pixel electrode.

10. The COA array substrate of claim 6, wherein an insulating layer is disposed between the lower common electrode and the upper common electrode, the lower common electrode is covered by the insulating layer, and a color resist layer is disposed between one of the data lines and the lower common electrode.

11. The COA array substrate of claim 6, wherein the metal sheet and the lower common electrode are made of a same material.

12. The COA array substrate of claim 11, wherein the pixel electrode, the upper common electrode, and the metal sheet are manufactured in a same manufacturing step.

13. A display device, comprising the COA array substrate of claim 6.

* * * * *